US011031405B2

(12) United States Patent
Fardad et al.

(10) Patent No.: US 11,031,405 B2
(45) Date of Patent: Jun. 8, 2021

(54) PERIPHERAL LOGIC CIRCUITS UNDER DRAM MEMORY ARRAYS

(71) Applicant: Micron Technology, Inc., Boise, ID (US)

(72) Inventors: Mansour Fardad, Allen, TX (US); Harish N. Venkata, Allen, TX (US); Jeffrey Koelling, Fairview, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/802,016

(22) Filed: Nov. 2, 2017

(65) Prior Publication Data

US 2019/0131308 A1    May 2, 2019

(51) Int. Cl.
| H01L 27/108 | (2006.01) |
| G11C 11/4091 | (2006.01) |
| G11C 11/408 | (2006.01) |
| G11C 11/4072 | (2006.01) |
| G11C 29/12 | (2006.01) |
| G11C 11/406 | (2006.01) |
| G11C 29/00 | (2006.01) |
| G11C 11/4097 | (2006.01) |
| G11C 5/02 | (2006.01) |

(52) U.S. Cl.
CPC .... *H01L 27/10897* (2013.01); *G11C 11/4072* (2013.01); *G11C 11/4085* (2013.01); *G11C 11/4091* (2013.01); *G11C 11/40615* (2013.01); *G11C 29/12* (2013.01); *G11C 29/816* (2013.01); *G11C 29/824* (2013.01); *H01L 27/10891* (2013.01); *G11C 5/025* (2013.01); *G11C 11/4097* (2013.01); *G11C 2029/1206* (2013.01)

(58) Field of Classification Search
CPC ................................................ H01L 27/10897
See application file for complete search history.

(56) References Cited

U.S. PATENT DOCUMENTS

| 5,892,703 | A  | * | 4/1999 | Raad ...................... | G11C 5/025 |
| | | | | | 365/230.01 |
| 6,787,825 | B1 | * | 9/2004 | Gudesen .................. | G11C 5/02 |
| | | | | | 257/278 |
| 2006/0151881 | A1 | * | 7/2006 | Yamada .............. | H01L 23/5283 |
| | | | | | 257/758 |
| 2012/0063209 | A1 | * | 3/2012 | Koyama .................. | G11C 7/12 |
| | | | | | 365/149 |
| 2012/0129301 | A1 | * | 5/2012 | Or-Bach ............. | H01L 21/6835 |
| | | | | | 438/129 |
| 2013/0285203 | A1 | * | 10/2013 | Hiroi ...................... | H01L 28/40 |
| | | | | | 257/532 |
| 2014/0104938 | A1 | * | 4/2014 | Castro ................. | H01L 27/2436 |
| | | | | | 365/163 |

\* cited by examiner

*Primary Examiner* — Douglas King
(74) *Attorney, Agent, or Firm* — Schwegman Lundberg & Woessner, P.A.

(57) ABSTRACT

Various embodiments comprise methods and related apparatuses formed from those methods for placing at least portions of peripheral circuits under a DRAM memory array, where the peripheral circuits are used to control an operation of the DRAM memory array. In an embodiment, a memory apparatus includes a DRAM memory array and at least one peripheral circuit formed under the DRAM memory array, where the at least one peripheral circuit includes at least one circuit type selected from sense amplifiers and sub-word line drivers. Additional apparatuses and methods are also disclosed.

19 Claims, 8 Drawing Sheets

PERIPHERAL LOGIC CIRCUITS UNDER DRAM MEMORY ARRAYS

BACKGROUND

Contemporary DRAM-based memory devices have become increasingly dense as the desire for more memory storage increases. While circuits used to form the DRAM storage areas (e.g., the pitch between wordlines (WL) and digit lines (DL)) continues to shrink, a concomitant reduction in support (e.g., peripheral) circuitry (e.g., transistors and associated metal lines) has not occurred. Therefore, the overall reduction in size of DRAM memories has not been reduced as much as is desired.

BRIEF DESCRIPTION OF DRAWINGS

Various ones of the appended drawings merely illustrate exemplary embodiments of the present invention and cannot be considered as limiting its scope.

DETAILED DESCRIPTION

Figure 1:
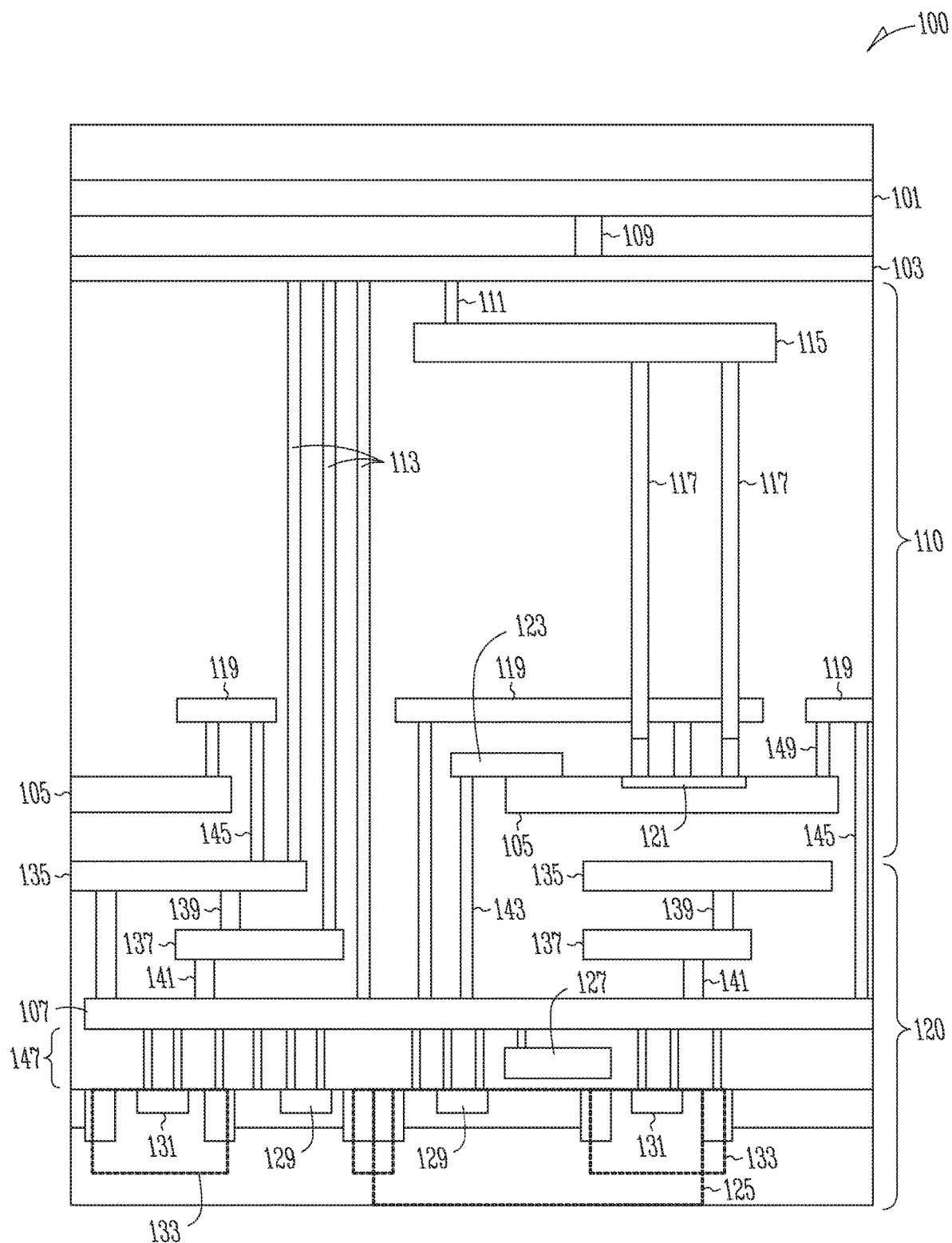
FIG. 1 shows a simplified cross-section of peripheral circuits formed under a memory array, according to various embodiments of the inventive subject matter disclosed herein.

In an effort to improve array efficiency (e.g., defined herein as a true memory size/total die size) on DRAM memory designs, an approach called peripheral circuit logic under the DRAM memory array is disclosed herein. With shrinking geometries of DRAM memory devices, the number of common manufacturing masks between peripheral circuits (e.g., data driver circuits and other circuits) and an associated memory array has been reduced significantly in recent years. Consequently, placing peripheral circuits under the memory array has become a viable fabrication alternative. While highly-generalized forms of the peripheral circuits under a DRAM memory array concept comes from NAND and other cross-point memory devices where it has been implemented, there are distinct differences between DRAM and other memory types, described in detail below, that have previously proved to be too challenging to implement for DRAM devices. For example, DRAM memory devices store information on capacitors in a very tight volume as compared with other memory types. Further, DRAM utilizes a larger number of layers than most memory types. Consequently, contemporary DRAM manufacturers place peripheral circuit (needed to deal with the stored information in the memory array) on an area outside of (e.g., adjacent to) the actual memory array itself.

The die size reduction that can be achieved and number of additional interconnect layers, along with its contact options needed to implement the peripheral circuit under DRAM devices, are disclosed herein. The resistance/capacitance factors for these interconnect layers is also discussed. Three different architectural options, Traditional, Quilt, and Quilt II, which are defined by how the pitch cells are organized, are disclosed along with various advantages and disadvantages of each architecture.

Although other memory types, such as SRAM, may not require the amount of peripheral circuitry as DRAM (e.g., due to refresh circuitry), DRAM has a much higher density than SRAM, is smaller and less expensive to fabricate per bit than SRAM, and has a relatively low power consumption as compared with most other types of high-density memory.

Contemporary DRAM device manufacturers have long been considering ways to improve array efficiency while reducing the die size on which the DRAM devices are formed. One factor to reduce the overall die size involves reducing the pitch of wordlines (WL) and digit lines (DL). Although the WL and DL pitch sizes have been reduced significantly in recent years, other required DRAM peripheral components have failed to be reduced in size proportionately. For example, transistors and metal layers (e.g., metal levels) have not been reduced in size significantly. Consequently, the overall reduction in die size has not approached expected levels.

The DRAM is well known for high density memory with reasonable speed grades for a very low price. To keep the cost of manufacturing down, design engineers evaluate options for efficient die size architecture for every project. However, most die size reductions have come from shrinking the memory cell. As noted above, while the memory cell has shrunk, the pitch cells have not been able to keep up proportionally, making them a larger percentage of die size. For example, on a recent 15 nm DDR4, it was found that 57% of the die is made up of memory cells and 5% with its dummies, termination and redundant cells. Pitch cells took up 25% of the die, while peripheral circuits added up to 10%, which includes bond pads, and 2.5% is scribe and other areas.

With reference now to FIG. 1, a simplified cross-section 100 of an embodiment of peripheral circuits formed under a memory array is shown to include a memory array area 110 and a peripheral circuit area 120. For ease in understanding the subject matter, only portions of a memory structure are shown. However, as will be apparent to a person of ordinary skill in the art, the portion of the memory structure may be one portion of a memory array formed substantially normal to a face of an underlying substrate on which the memory and peripheral circuits are formed. For example, DRAM memory arrays are arranged substantially perpendicular relative to a face of the substrate.

As described in more detail below, the peripheral circuit area 120 may include all support circuitry for the memory array area 110, or only portions of the peripheral circuitry, depending upon a design approach chosen. In various embodiments, the peripheral circuit area 120 is formed on a first substrate (not shown but readily understandable to a person of ordinary skill in the art). In embodiments, the peripheral circuit area 120 may be considered to be formed on a lower deck while the memory array area 110 is formed on an upper deck, where the lower deck is proximate to the first substrate and the upper deck is distal to the first substrate. In embodiments, the memory array area 110 may be formed on a second substrate (not shown). In various embodiments, the second substrate may be considered as forming a base of the upper deck. Each of the deck formation and substrate formation processes are known to a skilled artisan. For example, in one example, formation of the upper deck may begin by depositing or otherwise forming an amorphous silicon level. In certain embodiments, the amorphous silicon level may be annealed. Such deposition and fabrications processes are known in the art.

In various embodiments, the substrate can include, for example, any of various types of substrates used in the semiconductor and allied industries (which may be referred to herein as "semiconductor substrates," or "wafers," or simply "substrates"). Substrate types may therefore include silicon substrates (e.g., wafers) or substrates based on other elemental semiconductors, compound wafers (e.g., from Groups II-VI, or others), thin film head assemblies, polyethylene-terephthalate (PET) films deposited or otherwise formed with a semiconducting layer, or numerous other types of substrates known independently in the art. Also, the substrate may comprise a region of a semiconductor material formed over a non-semiconductor material, or vice-versa. For ease of understanding the activities and designs presented herein, the substrate may be considered to be a silicon wafer.

Devices formed in a lower deck are subject to effects from thermal processes during subsequent fabrication operations in the upper deck processing. The additional thermal effects can cause detrimental effects to certain types of materials. Therefore, materials selected for use in the lower deck are chosen to withstand potential thermal effects. These materials are discussed in more detail, below.

The simplified cross-section 100 is further shown to include a metal-2 level 101 and a metal-1 level 103. In a specific exemplary embodiment, the metal-2 level 101 may be comprised of aluminum and the metal-1 level 103 may be comprised of copper. However, the selection of metal levels is not limited to these materials or even to a selection of different metals for each level. Further, in other embodiments, only a single metal level (e.g., metal-1 level 103) may be employed. The skilled artisan will recognize how such a modification may be made based on the disclosure provided herein. Therefore, the specific exemplary embodiments provided herein are provided merely as an aid in illustrating designs and materials that may be suitable for the inventive subject matter. The metal-2 level 101 is electrically coupled to the metal-1 level 103 by a first via 109.

The memory array area 110 comprises a number of DRAM memory cells (not shown explicitly but known independently to a person of ordinary skill in the art). Further, the memory array area 110 is shown to include a capacitor polysilicon-level 115 with two additional interconnects 117 through the storage container region and a digit line (DL) 119, and coupled electrically to a DL access transistor 121. The DL access transistor 121 is located within a lower portion of the upper deck in a second-substrate region 105 (or a second or upper-level deck as explained above). A storage-container connect 149 is coupled to the DL 119 through a DL connect 145 to a level-0 conductive line 107. The capacitor polysilicon-level 115 is also electrically coupled to the metal-1 level 103 by a second via 111. A wordline 123 is coupled from the second-substrate region 105 to the level-0 conductive line 107 by a wordline connect 143.

FIG. 1 is also shown to include a level-2 conductive line 135 and a level-1 conductive line 137, with first local interconnects 139, between the level-2 conductive line 135 and the level-1 conductive line 137, and second local interconnects 141 between the level-1 conductive line 137 and the level-0 conductive line 107. A series of local interconnects 147 electrically couple the level-0 conductive line 107 to a lower portion of the lower deck (e.g., the substrate or devices formed on or in the substrate). The level-0 conductive line 107 is further coupled to lower-level polysilicon 127.

The peripheral circuit area 120 is further shown to include multiple n channels 129, a deep n-well 125, multiple p channels 131, and multiple n wells 133, which will be recognized by a person of ordinary skill in the art.

Although the simplified cross-section 100 is shown in a certain configuration, the skilled artisan, upon reading and understanding the disclosure provided herein, will recognize that various other arrangements are possible that are still within a scope of the disclosure provided. Therefore, the arrangement of the memory array and peripheral circuitry of FIG. 1 is provided merely as an overview of the various embodiments of the inventive subject matter.

The skilled artisan will further recognize the advantages of forming peripheral circuitry under the memory array, thereby achieving a significant reduction in die size. Although, as noted above, related concepts have been considered in, for example, NAND and other cross-point memory devices, there are significant process, memory operation, and speed requirement differences between these memory types and DRAM memory. Consequently, implementation of peripheral circuitry under a DRAM array must incorporate significant differences not required with other memory types as outlined in more detail below.

For example, there are limitations on current ratios for transistors in the support circuitry (e.g., $i_{on}$ and $i_{off}$ current ratios), thereby requiring a minimum metal line size to prevent electromigration and related issues. At one point, the capacitors used in DRAM memory arrays comprised 80% or more of the die size. However, with various technologies employed today, the capacitor size is only about 50% to 60% of the die size. Therefore, although the capacitor size has been reduced significantly (e.g., through the use of trench capacitors, stacked capacitors, etc.), the overall die size cannot be reduced further without significant reductions in the associated footprint of the peripheral circuitry. In addition, due to additional functionality incorporated in DRAM memory designs recently (e.g., error correction circuitry, equalization transistors for enhanced pre-charge, decoder complexity due to increased array capacities, changes in cell design (e.g., 1T1C to 3T1C, etc.), the size of the peripheral circuitry has actually increased.

Moreover, die size reductions in DRAM memory to date have been primarily due to WL and DL pitch reduction. The inventive subject matter disclosed herein provides significant reductions in die size (e.g., 30% or more) with minimal production cost increases. Further, added repair capabilities for the DRAM memory devices can readily be incorporated as discussed in more detail below. Coupled with memory size increasing by approximately a factor of four every two to three years, the inventive subject matter disclosed herein will play an increasingly important role in DRAM memory designs of the future.

Consequently, there are several distinct advantages to forming peripheral circuits under the array as shown and discussed above with reference to FIG. 1. Since the number of masks shared by the memory array and the support circuitry has become insignificant, there is no longer a compelling need to form both memory cells and peripheral (e.g., support) circuits at the same time (e.g., on the same level or adjacent one another). Further, by placing the peripheral circuitry under the array, a higher yield can be achieved by adding additional repair capability within the memory device. For example, extra fuses can also be placed under the memory array without increasing the die size. Despite these advantages, forming peripheral circuits under the memory array has never been attempted for at least the reasons noted above.

To more readily increase the amount of peripheral circuitry under the DRAM array, several DRAM memory architectural design modifications have been considered in various embodiments. These design modifications include shrinking memory device die sizes based on "Traditional" architectures as well as newly-disclosed "Quilt" and Quilt II" embodiments.

Architectural Design Modifications

Generally, architectures are defined by how pitch cells are organized under the array. For ease in understanding the inventive concepts, the disclosed disclosure provided herein assumes a memory core or tile size consisting of 1K physical word lines and 1K physical digit lines. Of course, upon reading and understanding the disclosure provided, the skilled artisan will recognize how to apply the inventive subject matter to other DRAM memory core sizes and designs.

Figure 2:
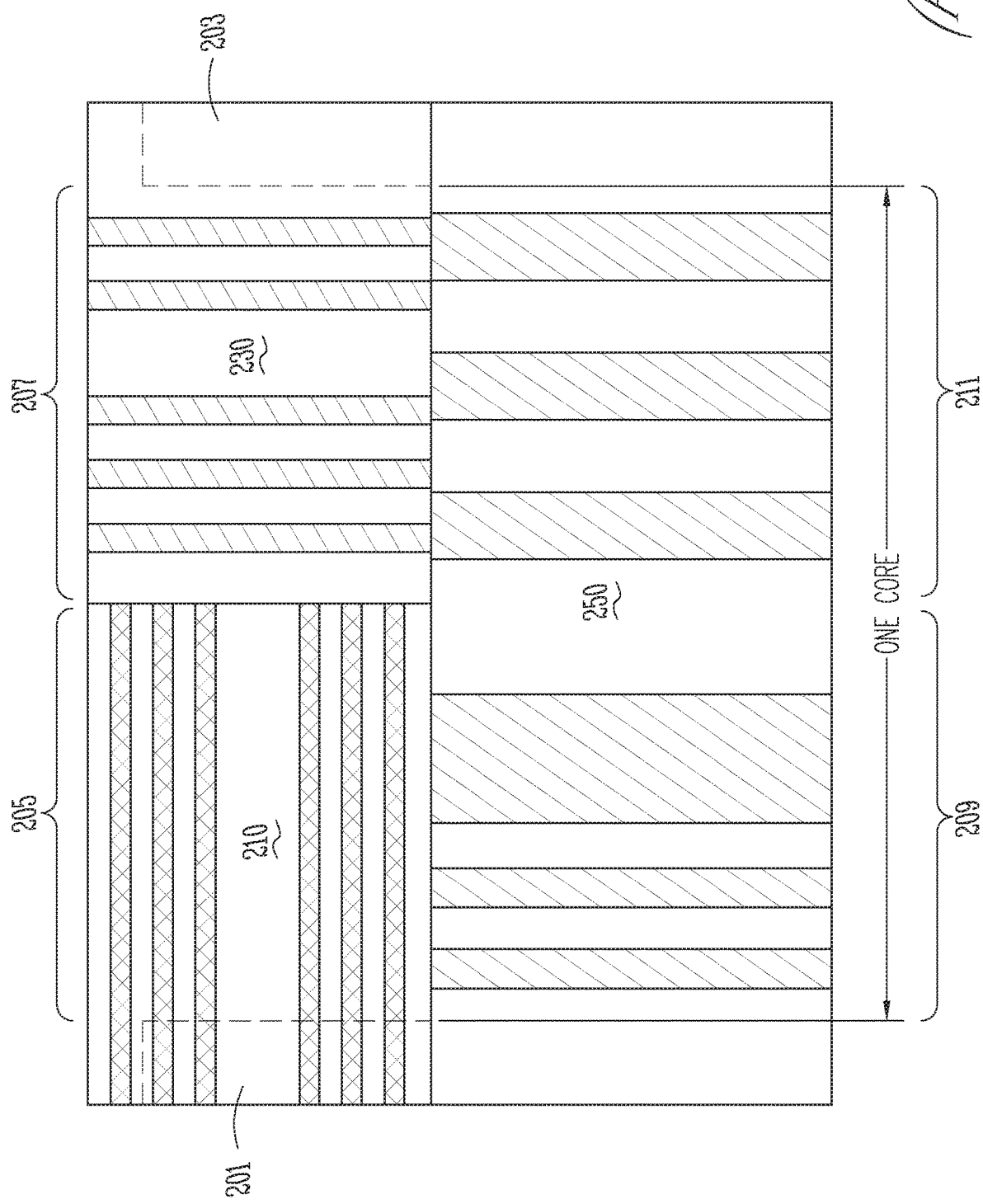
FIG. 2 shows a simplified typical arrangement of metal layers on a memory core in accordance with prior art DRAM designs.

FIG. 2 shows a highly-simplified, typical arrangement of metal layers on a memory core. FIG. 2 is shown to include a metal-1 layer 210, a metal-2 layer 230, and a metal-3 layer 250. The metal-1 layer 210 and the metal-2 layer 230 may include a first sub-word-line decoder (SWD) 201 and a second SWD 203, respectively. The metal-3 layer 250 may include an area with first metal input/output (MIO) lines 209 and a second area with MIO lines for data lines, as well as for bussing power to the memory array.

To route pitch cells and random logic under the array, the metal interconnect shown in FIG. 2, currently formed above the array, can be opened up. On contemporaneous DRAM commodity designs, the metal-1 layer 210 (comprising copper (Cu)) on core is used up for wordline decode signals (e.g., MWLB, FXT, FXB, known independently in the art). The metal-2 layer 230 (also comprising Cu) is used for column select (CSel) lines. The metal-3 layer (comprising aluminum (Al)) is used for MIO lines 209/211 and power bussing, as noted above.

In a specific exemplary as discussed in more detail below, to reduce metal-1 lines on core, a final main wordline decode NAND gate can be made local to a sub-word-line decoder (SWD). This embodiment increases a size of the SWD size but reduces the metal-1 on core from 128 lines down to 24 lines. Similarly, column decode circuitry can be made local to sense amplifiers (SAs), thereby reducing metal-2 lines on core from 128 lines down to 18 lines. In this embodiment, the metal-3 layer on core is left as is found in a typical DRAM design. With these basic assumptions, the three architectures (Traditional, Quilt, and Quilt II) were considered for active-area placement, potential routing plan issues, and reduction in die size.

In general, high temperatures are used while forming a storage container capacitor for the DRAM memory cells. Consequently, if metals such as copper and aluminum are deposited before building the capacitor, the Cu and Al metals will melt. Therefore, other alternative interconnects that can withstand the elevated temperatures encountered during later process steps need to be considered. In a specific exemplary embodiment, tungsten (W) was chosen to form various metal layers and interconnects. Tungsten can be built on a small pitch, for example, as low as 50 nm, which can be coupled electrically to SWD and SA areas. However, at this small pitch, the thickness is correspondingly small, thereby making the tungsten lines highly resistive. The designs considered herein have accounted for the increase in resistance. Additionally, the skilled artisan will recognize other materials (e.g., polysilicon or other materials known in the art) that be used in addition to, or instead of, tungsten.

The pitch cells SWD and SA for contemporary DRAM use three interconnect layers. In SWD, metal-0 is used to connect transistors, metal-1 (Cu) for phase signals (e.g., FXT, FXB known independently in the art), and metal-2 (Cu) for MWLB. Similarly, for SAs, metal-0 is used to connect transistors, metal-1 for line I/O and control signals, and metal-2 for column select (CSEL) signals. By placing a final driver of MWLB by every SWD, MWLB signals can be connected in polysilicon, thereby eliminating metal-2 in SWD. Similarly, if a column decoder is placed next to each SA, then metal-2 can be eliminated in SA as well. The metal-1 and metal-2 layers in pitch cells are replaced, as noted above, by tungsten layers W1 and W2. The minimum pitch of W1 and W2 is then determined by any layout limitations.

Architectures—Traditional

Figure 3:
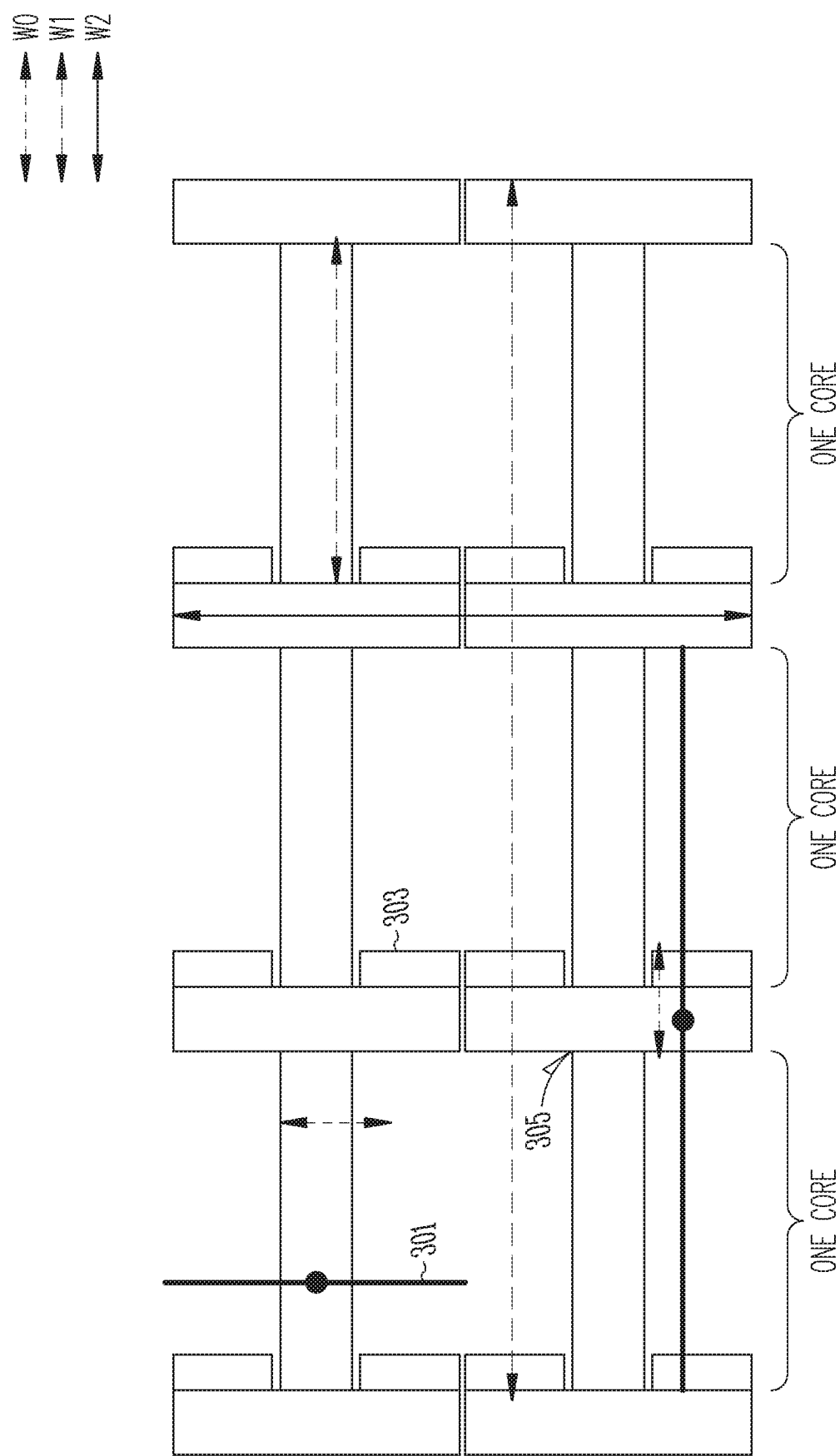
FIG. 3 shows an embodiment of a "Traditional Architecture" employing sense amplifiers (SA) or other peripheral circuits under the memory core.

In a traditional architecture, the pitch cells are placed similarly to current DRAM designs as shown in FIG. 3, hence the name "traditional architecture." The traditional architecture of FIG. 3 is shown to include a sense amp line 301, a main word driver (MWD) 303, and an SWD 305. However, in this architecture, at least one of either the sense amplifier or the sub-wordline-driver circuits, or both, can be placed under the array. Generally, a sense amplifier circuit is two to three times larger than a sub-wordline driver circuit. Consequently, the SA circuit may be a first consideration for placing under the memory array for commodity DRAM devices.

One benefit of traditional architecture is that there is neither a WL nor a DL length restriction for this architecture. The length restrictions are defined by performance requirements. The core size is the same as or similar to a typical DRAM commodity design with no extra dummy cells or termination. The WL length, in this embodiment, is limited to 1K and 2K. LIO lengths are the same as or similar to previous designs as well. Notice, with continued reference to FIG. 3, that the active area opening under the core or tile is substantially square with WL and DL contact fences on all four sides. While the clean active area opening gives easy placement for random logic, interconnect of random logic and peripheral circuits from one tile to other has to go through one or more WL/DL contact fences, or has to transition to metal layers above the array and back down to lower level metal layers, to interconnect below the array.

If SWD circuits are not formed under the array, the die size for this architecture depends on SWD size. WL contacts can be staggered several times on SWD, thereby relaxing WL contact pitch compared to either of the Quilt Architectures, discussed in more detail below, or even contemporaneous DRAM commodity design. The socket size is then expected to be relatively large as the SWD circuitry is not under the array.

Architectures—Quilt

Figure 4:
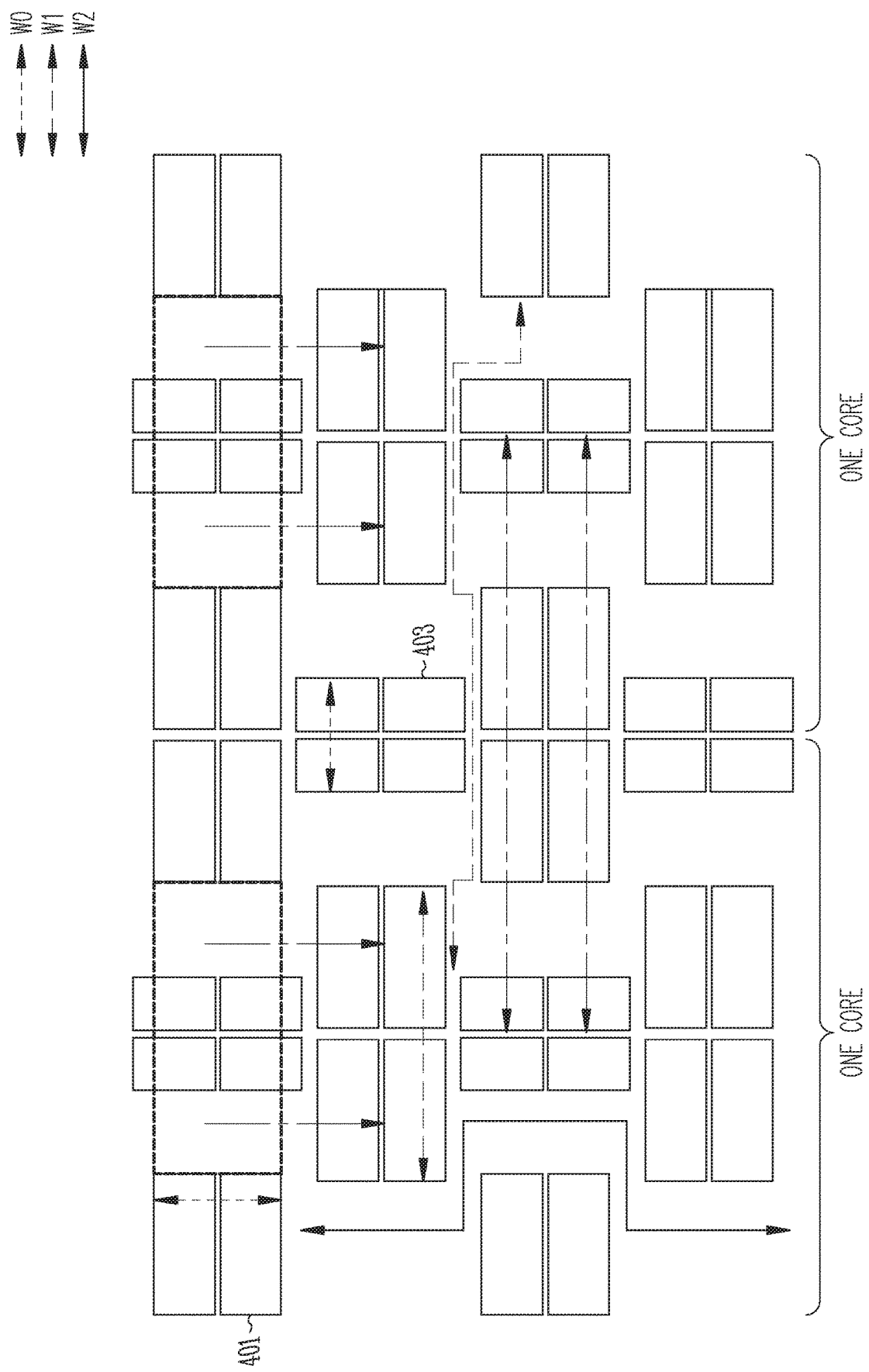
FIG. 4 shows an embodiment of a "Quilt Architecture" with SAs and sub-word line drivers (SWD) staggered by an approximately half-core length to increase circuitry under the memory array.

FIG. 4 shows "Quilt Architecture" with SAs 401 and sub-wordline drivers (SWDs) 403 staggered by an approximately half-core length to increase circuitry under the memory array, where the core length is a characteristic dimension of at least one side of the memory core. In the Quilt Architecture, half of pitch cell strip, sub-wordline driver, and sense amplifier circuitry is staggered by approximately a half-core length. With the SWD and SA stagger, the associated wordlines (WL) and digit lines (DL) also will be staggered. Because of the staggering for the WL and DL, a minimum WL length, $WL_{length}$, can be defined by, for example, $$WL_{length} \geq 4 \times (SWD + MWD + SWD/SA_{min})$$

where $SWD/SA_{min}$ is a minimum space needed between the sub-word line driver and the sense amp. A skilled artisan will recognize the minimum space needed for a given layout.

Similarly, a minimum WL length, $WL_{length}$, can be defined by, for example, $$DL_{length} \geq 4 \times (SA + SWD/SA_{min}).$$

Formation of the WL and DL lengths will benefit from precision formation (e.g., within 10 nm to 15 nm) at the stagger, which may be challenging with current fabrication technology. However, a number (e.g., four) dummy WLs and DLs may be added at the stagger to retain live cells. One benefit of this architecture is that pitch interconnect routes can pass from one core to another without punching through either WL and DL contacts or without using any interconnect layers above the array. Since the pitch cells are staggered by approximately a half-core length, this staggering creates twice the core breaks, which translates to twice the termination and dummy cells. In this embodiment, all the pitch cells can be placed under the array, with a small inefficiency due to any extra termination and dummy cells if needed. The die size in this architecture is determined by WL and DL contact size or the socket size (e.g., intersection of WL/DL contacts used to connect interconnects above and below the array).

Utilizing the Quilt Architecture, since SWD is staggered by the approximate half core length, there are four different WL lengths, 0.5K, 1K, 1.5K, and 2K, which may affect various DRAM timing delays. For example, a row-address-to-column address delay (tRCD) and write recovery-time (tWR) specifications may be affected. The SA and SWD strip control lines are then routed around SWD and SA circuitry, respectively, making the control lines longer and possibly congested at corners. The LIO length increases because SA strip is not 1K digits. However, the skilled artisan will understand how to determine and update a new activation scheme and test patterns as needed. Additionally, the skilled artisan will also need to consider the now-staggered active area available outside pitch cells to determine changes needed for random logic and peripheral circuitry and routing. Based on the disclosure provided herein, the changes needed may be determined readily.

Architectures—Quilt II

Figure 5:
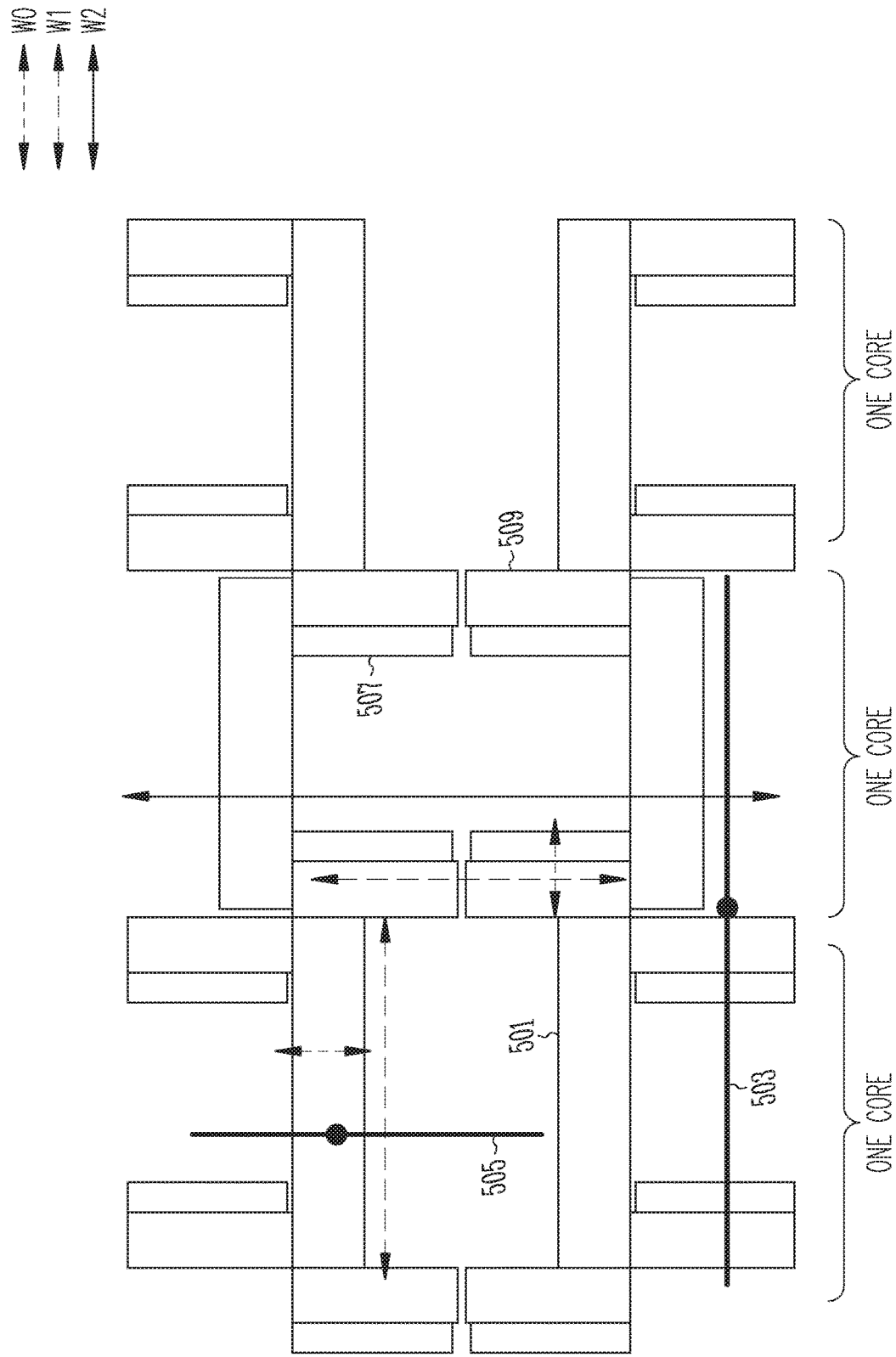
FIG. 5 shows an embodiment of a "Quilt II Architecture" incorporating, for example, both SAs and SWDs under the memory core.

FIG. 5 shows a "Quilt II Architecture" incorporating both SAs and SWDs under the memory core. In addition to other sections, FIG. 5 is shown to include a sense amplifier 501, a wordline 503, a digit line 505, an MWD 507, and an SWD 509. The Quilt II Architecture therefore combines benefits of both Quilt and Traditional architectures, where all pitch cells may be formed under the array without staggering the strip of pitch cells. The memory core size can be the same as or similar to a traditional core size so that no extra dummy cells or termination are needed. In this architecture, a restriction is made to a memory cell where a DL and a reference DL can be contacted to an SA anywhere along the DL. Also, even and odd SWDs may be placed be on one side, as discussed in more detail below, thus providing additional considerations for one SWD to connect to WLs.

Interconnect Requirements

As noted above, the various embodiments for the Quilt Architecture and the Quilt II Architecture utilize three interconnect layers under the array for basic DRAM operation. While the Traditional Architecture can be implemented with just two interconnect layers, the third interconnect layer gives flexibility and improved power strapping. Consequently, the embodiments discussed herein assumes using three interconnect layers for all three architectures. However, upon reading and understanding the disclosure provided, the person of ordinary skill in the art can envision other configurations of interconnect layers consistent with the scope of the inventive subject matter.

The Traditional Architecture and the Quilt II Architecture are each fenced by WL and DL contacts as shown in FIGS. 3 and 5. Therefore, to pass interconnect from one core to another, both architectures need to punch through the fence. As noted above, the Quilt Architecture has pitch cells staggered, so interconnects do not have to punch through a fence as shown in FIG. 4. However, if WL and DL lengths are not sufficiently long, then SWD and SA could get close, blocking off interconnects from passing. For example, with reference again to FIG. 4, W2 can weave through pitch cells, while W1 is blocked, forcing interconnects to punch through a contact fence.

Figure 6:
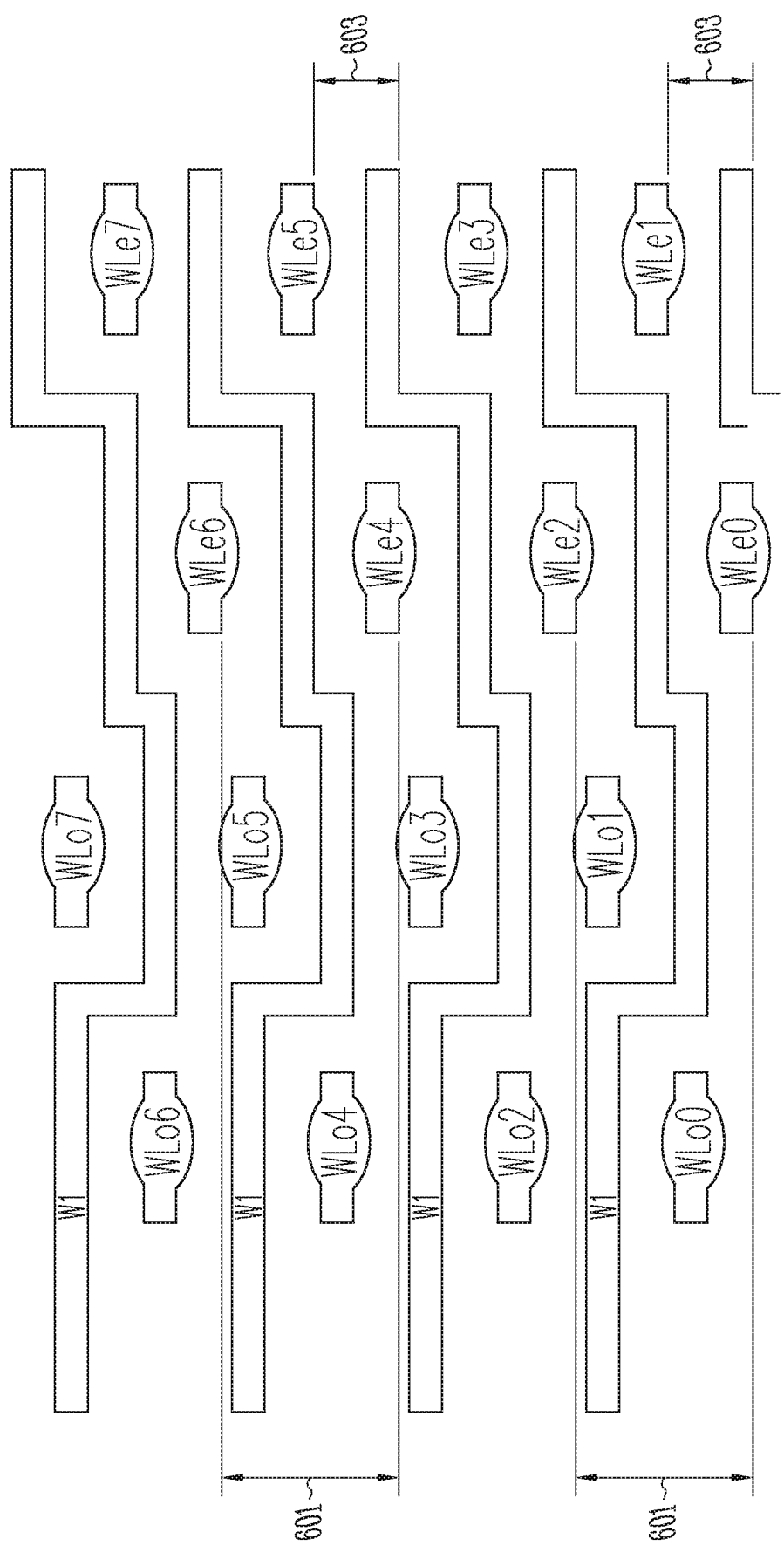
FIG. 6 shows an embodiment for passing a first tungsten (W1) layer between WL and DL contacts.

While there are multiple ways of punching interconnects through contacts, one way is shown in FIG. 6. In addition to other sections, FIG. 6 is shown to include a first distance 601 (defined in this embodiment as having a pitch of 4× WL/DL) between adjacent wordlines in a column (in this case between even wordlines 4 and 6, as well as between even wordlines 0 and 2). FIG. 6 also shows a second distance 603 (defined in this embodiment as having a pitch of 2×WL/DL) between wordlines and a nearest W1 layer routed around the WLs. Consequently, FIG. 6 shows an embodiment for passing a first tungsten (W1) layer between WL and DL contacts. The contacts are staggered to pass through interconnects, which results, in a specific exemplary embodiment, in a 2×WL/DL pitch of 96 nm for interconnect. At this pitch, W1 was an appropriate interconnect to punch through. For repeatability, W2 was chosen in this embodiment at 4×WL/DL pitch, or 192 nm.

With a pitch defined for the interconnect layers, example thickness ranges and parasitics for various embodiments were determined by process integration (PI) and are shown in Table I, below. Several simulations including parameters such as WL speed, write speed, DL sensing, and standard cell logic were compared between W1 and M1. The low R and high C simulation of tungsten was always close to simulation with metal and was therefore chosen accordingly.

TABLE I

Interconnect Layer Parasitic Ranges

| Layer | Pitch [nm] | Height [nm] | R [ohm/sq] | C [fF/μm] |
|---|---|---|---|---|
| W2 | 192 | 320 | 0.44 | 0.320 |
|  |  | 270 | 0.52 | 0.250 |
| W1 | 96 | 130 | 1.08 | 0.375 |
|  |  | 70 | 2.00 | 0.230 |
| W0 | 54 | 60 | 2.40 | 0.140 |

Figure 7:
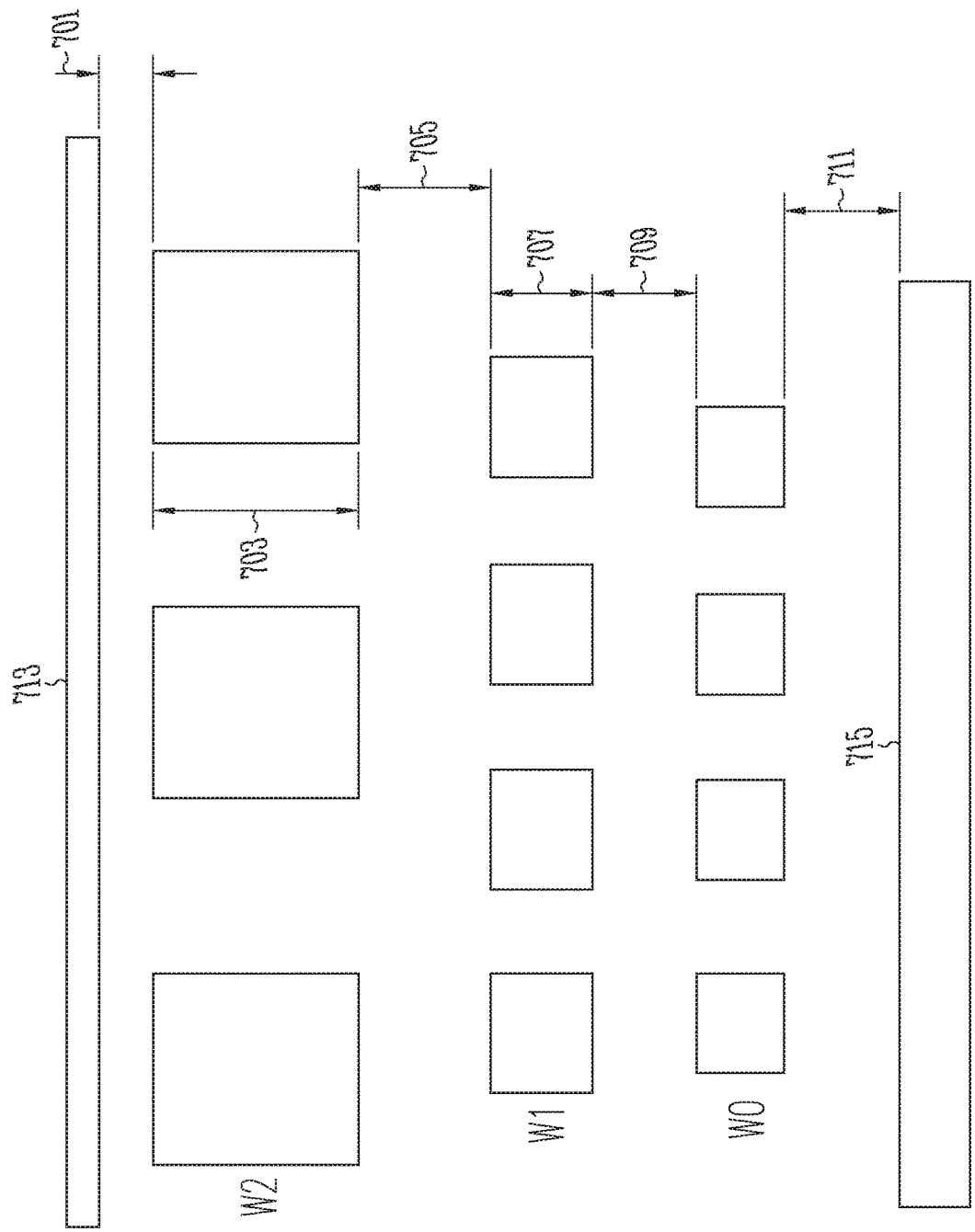
FIG. 7 shows an embodiment of an arrangement of interconnect layers under a DRAM memory array.

Table II, below, shows an example of parasitic comparisons between various interconnect layers for a given pitch that was used on an embodiment incorporating a particular DDR4 design. FIG. 7 shows an embodiment of an arrangement of interconnect layers under the array. A first distance

701 of about 200 nm is an example distance between the W2 layer an overlying digit line 713. In this embodiment, the W2 layer is about 300 nm thick. A second distance 705 between the W2 layer and the W1 layer is about 250 nm. The W1 layer has a thickness 707 of about 130 nm. A third distance 709 between the W1 layer and the W0 layer is about 100 nm. A fourth distance 711 between the W0 layer and underlying peripheral circuits 715 (e.g., the CMOS layer) is about 280 nm. In this specific exemplary embodiment, the relative W-layer thicknesses and spacing between layers are provided as examples only. The skilled artisan will recognize how these thicknesses and spacings may be changed to accommodate other DRAM designs that are still consistent with the disclosure provided herein.

TABLE II

Interconnect layer R and C for a given pitch

| Layer | Pitch [nm] | R [ohm/μm] | C [fF/μm] |
|---|---|---|---|
| W2 | 300 | 3.13 | 0.259 |
| W1 | 240 | 9.00 | 0.228 |
| M2 | 300 | 0.52 | 0.290 |
| M1 | 240 | 1.22 | 0.230 |

Figure 8A:
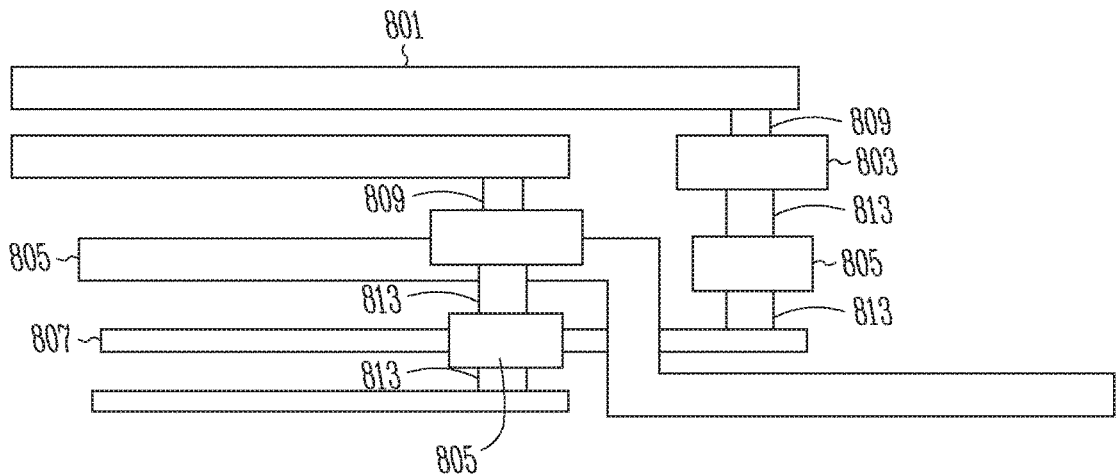
FIGS. 8A-8C show various embodiments of WL and DL contact options.
Figure 8B:
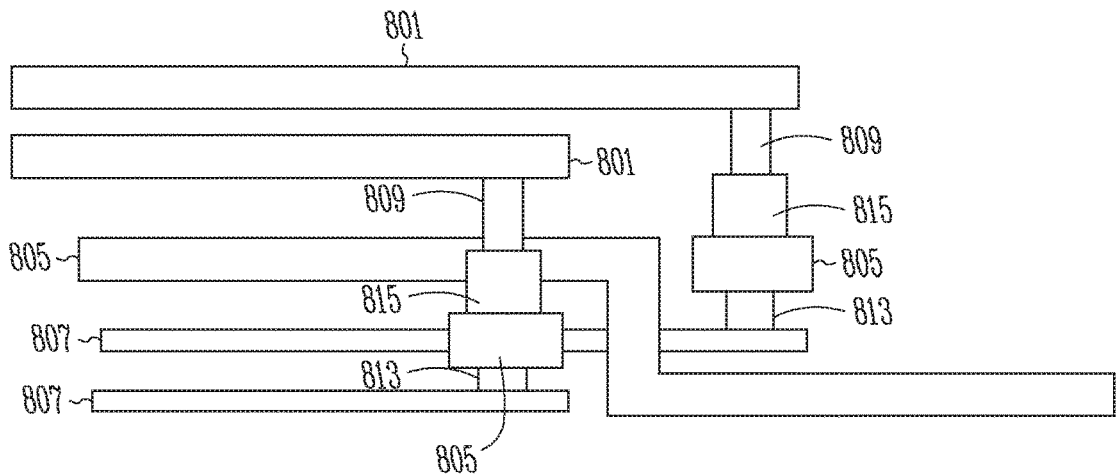
Figure 8C:
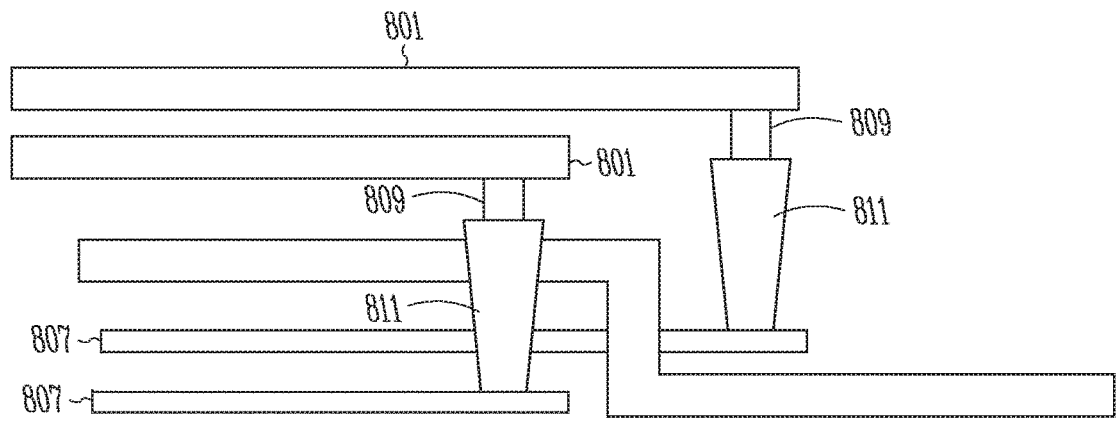

With reference now to FIGS. 8A through 8C, various embodiments of WL and DL contact options are shown. FIGS. 8A-8C are shown to include a wordline/digit line layer 801, a W2 layer 803, a W1 layer 805, and a W0 layer 807. Also shown are WL/DL interconnects 809, and interconnect vias 811, as well as other interconnects 813, 815. However, these figures are provided merely as simplified examples of various layout possibilities and should not be taken as limiting the inventive subject matter provided herein. Consequently, upon reading and understanding the disclosure provided, the person of ordinary skill in the art can readily understand the layouts of FIGS. 8A-8C and be able to modify them as needed for a given DRAM design. Such designs are considered to be within a scope of the present disclosure.

SUMMARY

The three architectures, Traditional, Quilt, and Quilt II, discussed herein each provide similar performance parameters and each provide an approximately 20% reduction in die size. The Traditional and Quilt II architectures provide more usable active area under the array while the Quilt architecture gives the flexibility of interconnect between cores without punching through WL and DL contacts. If the WL and DL length is long enough, with low R on interconnect layers, the Quilt architecture is more efficient compared to the Traditional and Quilt II architectures.

As discussed above, the disclosed subject matter may be employed in other semiconductor DRAM device fabrication sequences, or even in the fabrication sequences of allied industries such as flat panel displays, optical recording substrates, thin film head development, as well as on a variety of other substrate types known in various arts.

The present disclosure is therefore not to be limited in terms of the particular exemplary embodiments described in this application, which are merely intended as illustrations of various aspects. Many modifications and variations can be made, as will be apparent to a person of ordinary skill in the art upon reading and understanding the disclosure provided herein. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is therefore to be limited only by the terms of the appended claims, along with the full scope of equivalents to which such claims are entitled. It is also to be understood that the terminology used herein is for the purpose of describing particular embodiments only and is not intended to be limiting.

Moreover, as used herein, the term "or" may be construed in an inclusive or exclusive sense unless otherwise explicitly noted or operationally defined. Additionally, although various exemplary embodiments described above focus on various general and specific exemplary embodiments, the embodiments are merely given for clarity in disclosure, and thus, are not limited to a particular type or design of a DRAM device, or even to memory devices in general. Moreover, as used herein, the term "exemplary" refers to one example or a set of examples only, and should not necessarily be construed as the preferred or best way to implement portions of the disclosed subject matter.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features or operations are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method, comprising:
   forming at least, one peripheral circuit; and
   forming a DRAM memory array over the at least one peripheral circuit, the at least one peripheral circuit configured to control an operation of the DRAM memory array, wherein forming the DRAM memory array includes:
   forming an access transistor over the at least one peripheral circuit;
   forming a digit line over the access transistor and coupled to the access transistor and the at least one peripheral circuit;
   forming a wordline over the access transistor and coupled to the access transistor and the at least one peripheral circuit; and
   forming a capacitor structure over the digit line and the wordline and coupled to the access transistor;
   wherein forming the at least one peripheral circuit includes forming a first level of conductive line under the access transistor and coupled to the access transistor, and forming a second level of conductive line under the access transistor and between the access transistor and the first level of conductive line, the second level of conductive line coupled to the first level of conductive line, and wherein the peripheral circuit comprises sense amplifiers and sub-word line drivers; and
   staggering the sense amplifiers and the sub-word line drivers by an approximately half-core length, the core length being a characteristic dimension of at least, one side of the DRAM memory array.

2. The method of claim 1, wherein the at least one peripheral circuit is CMOS based.

3. The method of claim 1, further comprising staggering associated word lines and digit lines.

4. The method of claim 1, further comprising routing pitch interconnects between memory cores without punching through either wordline or digit line contacts.

5. The method of claim 1, further comprising routing pitch interconnects between memory cores without using interconnect layers formed above the DRAM memory array.

6. The method of claim 1, further comprising forming column decode circuitry next to a corresponding sense amplifier circuit.

7. The method of claim 1, further comprising forming interconnect layers from tungsten.

8. The method of claim 1, further comprising forming all pitch cells under the DRAM memory array.

9. The method of claim 1, further comprising forming all pitch cells under the DRAM memory array without staggering the pitch cells.

10. A memory apparatus, comprising:
a DRAM memory array; and
at least one peripheral circuit formed under the DRAM memory array, the at least one peripheral circuit being configured to control an operation of the DRAM memory array, the DRAM memory array including:
an access transistor located over the at least one peripheral circuit;
a first digit line located over the access transistor and coupled to the access transistor and the at least one peripheral circuit;
a wordline located over the access transistor and coupled to the access transistor and the at least one peripheral circuit;
a capacitor structure located over the first digit line and the wordline and couple to the access transistor;
wherein the at least one peripheral circuit includes a first level of conductive line under the access transistor and coupled to the access transistor, and a second level of conductive line under the access transistor and between the access transistor and the first level of conductive line, the second level of conductive line coupled to the first level of conductive line; and
a second digit line located over the access transistor and coupled to the second level of conductive line; and
the peripheral circuit comprises sense amplifiers and sub-word line drivers, the sense amplifiers and the sub-word line drivers staggered by an approximately half-core length, the core length being a characteristic dimension of at least one side of the DRAM memory array.

11. The memory apparatus of claim 10, wherein the at least one peripheral circuit includes a refresh circuit.

12. The memory apparatus of claim 10, wherein the at least one peripheral circuit includes a pre-charge circuit.

13. The memory apparatus of claim 10, wherein the at, least one peripheral circuit includes a column address circuit.

14. The memory apparatus of claim 10, wherein the at least one peripheral circuit includes a row/column repair circuit.

15. The memory apparatus of claim 10, wherein the at least one peripheral circuit includes a row-column control circuit.

16. The memory apparatus of claim 10, wherein the at, least one peripheral circuit includes a test mode circuit.

17. The memory apparatus of claim 10, wherein the at least one peripheral circuit includes data driver circuits.

18. The memory apparatus of claim 10, wherein the at least one peripheral circuit includes analog circuits.

19. A memory apparatus, comprising:
a DRAM memory array; and
at least one peripheral circuit formed under the DRAM memory array, the at least one peripheral circuit including at least one circuit type selected from sense amplifiers and sub-word line drivers, the DRAM memory array including:
an access transistor located over the at least one peripheral circuit;
a digit line located over the access transistor and coupled to the access transistor and the at least one peripheral circuit;
a wordline located over the access transistor and coupled to the access transistor and the at least one peripheral circuit; and
a capacitor structure located over the digit line and the wordline and couple to the access transistor; and
wherein the at least one peripheral circuit includes a first level of conductive line under the access transistor and coupled to the access transistor, and a second level of conductive line under the access transistor and between the access transistor and the first level of conductive line, the second level of conductive line coupled to the first level of conductive line; and
a second digit line located over the access transistor and coupled to the second level of conductive line and
the peripheral circuit comprises sense amplifiers and sub-word line drivers, the sense amplifiers and the sub-word line drivers staggered by an approximately half-core length, the core length being a characteristic dimension of at least one side of the DRAM memory array.

* * * * *